US011233001B2

(12) United States Patent
Miki et al.

(10) Patent No.: US 11,233,001 B2
(45) Date of Patent: Jan. 25, 2022

(54) ADHESIVE LAYER BONDING A PLURALITY OF SUBSTRATES HAVING A FILLET RAISED PORTION

(71) Applicant: SHINKO ELECTRIC INDUSTRIES CO., LTD., Nagano (JP)

(72) Inventors: Shota Miki, Nagano (JP); Naoki Kobayashi, Nagano (JP)

(73) Assignee: SHINKO ELECTRIC INDUSTRIES CO., LTD., Nagano (JP)

(*) Notice: Subject to any disclaimer, the term of this patent is extended or adjusted under 35 U.S.C. 154(b) by 0 days.

(21) Appl. No.: 16/712,347

(22) Filed: Dec. 12, 2019

(65) Prior Publication Data
US 2020/0211946 A1    Jul. 2, 2020

(30) Foreign Application Priority Data
Dec. 26, 2018 (JP) .............................. JP2018-243631

(51) Int. Cl.
| H01L 23/34  | (2006.01) |
| H01L 23/48  | (2006.01) |
| H01L 23/28  | (2006.01) |
| H01L 21/00  | (2006.01) |
| H01L 21/44  | (2006.01) |
| H05K 1/00   | (2006.01) |
| H05K 1/14   | (2006.01) |
| H05K 7/00   | (2006.01) |
| H01L 23/498 | (2006.01) |
| H01L 23/00  | (2006.01) |

(Continued)

(52) U.S. Cl.
CPC .... *H01L 23/49822* (2013.01); *H01L 23/3128* (2013.01); *H01L 23/49816* (2013.01); *H01L 23/522* (2013.01); *H01L 24/13* (2013.01); *H01L 24/14* (2013.01); *H01L 24/16* (2013.01); *H01L 24/17* (2013.01); *H01L 24/29* (2013.01); *H01L 24/81* (2013.01); *H01L 25/0657* (2013.01); *H01L 25/50* (2013.01)

(58) Field of Classification Search
CPC ..... H01L 25/0657; H01L 24/14; H01L 24/16; H01L 24/17; H01L 24/29; H01L 25/50; H01L 24/81; H01L 23/49822; H01L 23/522; H01L 23/49816; H01L 24/13; H01L 23/3128
See application file for complete search history.

(56) References Cited

U.S. PATENT DOCUMENTS

| 8,791,562 B2 * | 7/2014 | Lee ...................... H01L 25/0657 257/698 |
| 2007/0246815 A1 * | 10/2007 | Lu .......................... H01L 24/73 257/686 |

(Continued)

FOREIGN PATENT DOCUMENTS

JP          2004-079658          3/2004

*Primary Examiner* — Alonzo Chambliss
(74) *Attorney, Agent, or Firm* — Rankin, Hill & Clark LLP

(57) ABSTRACT

An interconnect board includes: a first substrate; a second substrate having an outer shape smaller than an outer shape of the first substrate and mounted on the first substrate; and an adhesive layer bonding the first substrate and the second substrate together and having a fillet contacting a side surface of the second substrate. The fillet has a raised portion raised from a level of a top surface of the second substrate to a level higher than the top surface of the second substrate.

14 Claims, 14 Drawing Sheets

(51) Int. Cl.
*H01L 23/522* (2006.01)
*H01L 23/31* (2006.01)
*H01L 25/065* (2006.01)
*H01L 25/00* (2006.01)

(56) References Cited

U.S. PATENT DOCUMENTS

| | | | | |
|---|---|---|---|---|
| 2007/0278640 | A1* | 12/2007 | Weng | H01L 25/162 |
| | | | | 257/686 |
| 2007/0278696 | A1* | 12/2007 | Lu | H01L 23/3121 |
| | | | | 257/777 |
| 2008/0157325 | A1* | 7/2008 | Chow | H01L 23/3128 |
| | | | | 257/686 |
| 2009/0091015 | A1* | 4/2009 | Shen | H01L 24/73 |
| | | | | 257/686 |
| 2009/0284947 | A1* | 11/2009 | Beddingfield | H01L 23/49833 |
| | | | | 361/818 |
| 2010/0244223 | A1* | 9/2010 | Cho | H01L 23/552 |
| | | | | 257/690 |
| 2011/0241168 | A1* | 10/2011 | Kim | H01L 25/0657 |
| | | | | 257/532 |
| 2012/0211885 | A1* | 8/2012 | Choi | H01L 21/563 |
| | | | | 257/737 |
| 2013/0075915 | A1* | 3/2013 | Kim | H01L 24/73 |
| | | | | 257/773 |
| 2014/0299980 | A1* | 10/2014 | Choi | H01L 24/97 |
| | | | | 257/698 |
| 2015/0003029 | A1* | 1/2015 | Okada | H01L 25/105 |
| | | | | 361/783 |
| 2016/0141271 | A1* | 5/2016 | Lee | H01L 21/565 |
| | | | | 257/712 |

\* cited by examiner

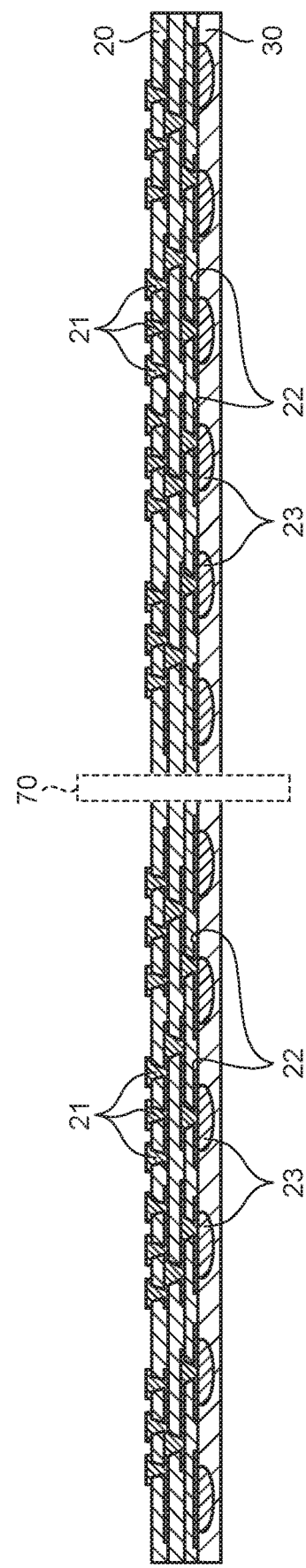

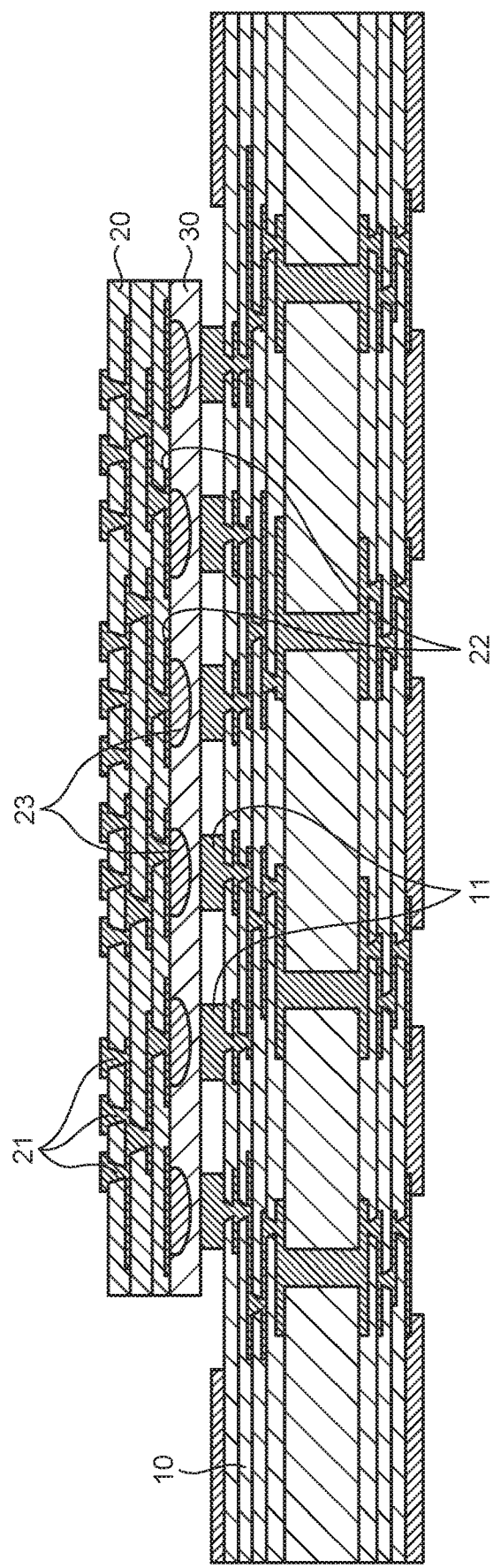

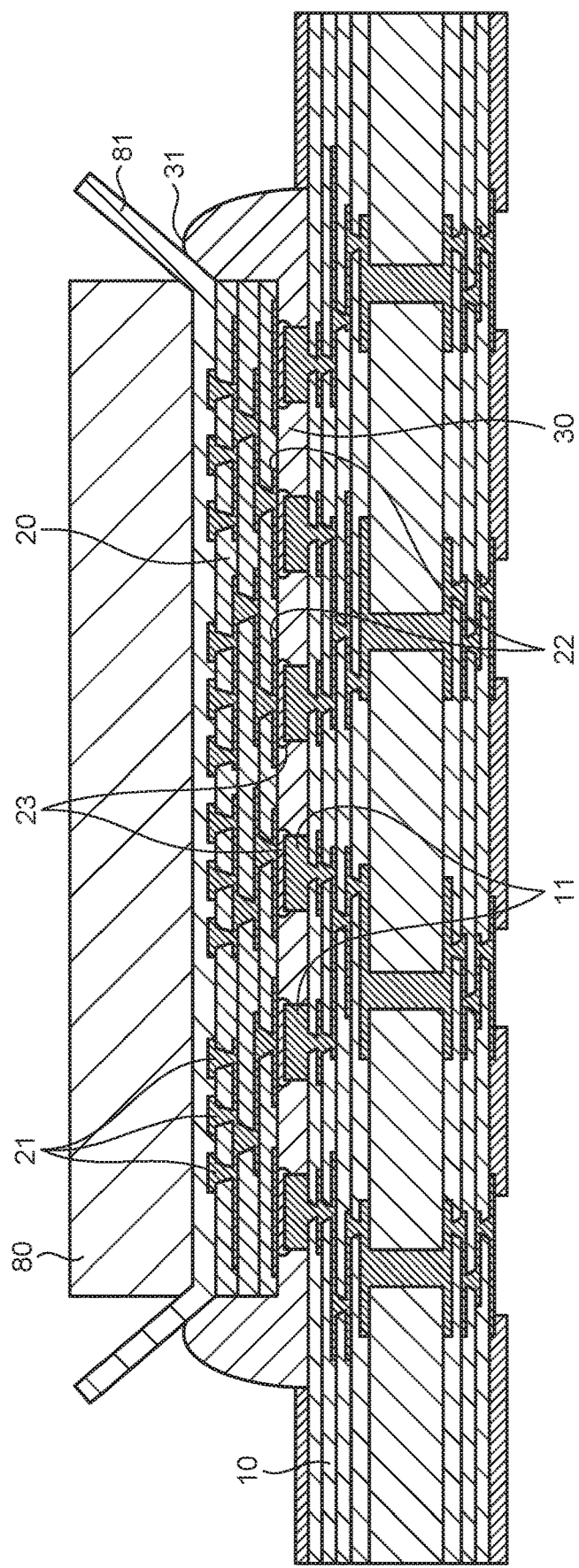

ADHESIVE LAYER BONDING A PLURALITY OF SUBSTRATES HAVING A FILLET RAISED PORTION

CROSS-REFERENCE TO RELATED APPLICATION

This application is based upon and claims the benefit of priority of the prior Japanese Patent Application No. 2018-243631, filed on Dec. 26, 2018, the entire contents of which are incorporated herein by reference.

FIELD

The embodiment discussed herein is related to an interconnect board, a semiconductor package, and a method of fabricating the interconnect board.

BACKGROUND

Conventional interconnect boards usually have an upper substrate, serving as an interposer, mounted on a lower substrate such as a build-up substrate. This type of interconnect board usually has the lower substrate and the upper substrate bonded together. More specifically, the upper substrate and the lower substrate are bonded to each other with an adhesive layer, for example, made of a thermosetting resin. Conventional technologies are described in Japanese Laid-open Patent Publication No. 2004-79658, for example.

In the process of connecting the lower substrate with the upper substrate using the adhesive layer, the upper substrate with the adhesive layer is placed on the lower substrate with the adhesive layer held therebetween. The upper substrate is then pressed against the lower substrate with a bonding tool. An outer edge portion of the adhesive layer held between the upper and the lower substrates is extended in a direction perpendicular (that is, horizontally) to the direction of thickness of the adhesive layer. The extended outer edge portion sticks out beyond the side surface of the upper substrate and contacts the side surface of the upper substrate. The formed area is called a fillet.

Since the fillet formed at the adhesive layer is horizontally extended along the top surface of the lower substrate, usable space on the top surface of the lower substrate is narrowed due to the fillet. As a result, it becomes difficult to secure areas for mounting devices around the fillet.

SUMMARY

According to an aspect of an embodiment, an interconnect board includes a first substrate; a second substrate having an outer shape smaller than an outer shape of the first substrate and mounted on the first substrate; and an adhesive layer bonding the first substrate and the second substrate together and having a fillet contacting a side surface of the second substrate, wherein the fillet has a raised portion raised from a level of a top surface of the second substrate to a level higher than the top surface of the second substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3D is still another illustrative drawing of the example flow to fabricate the interconnect board according to the example;

FIG. 3E is still another illustrative drawing of the example flow to fabricate the interconnect board according to the example;

FIG. 3G is still another illustrative drawing of the example flow to fabricate the interconnect board according to the example;

DESCRIPTION OF EMBODIMENT

Examples of an interconnect board, a semiconductor package, and a method of fabricating the interconnect board according to the present application will now be described in detail with reference to the drawings. The examples are not intended to limit the techniques herein disclosed.

Examples

Configuration of Interconnect Board

Figure 1:
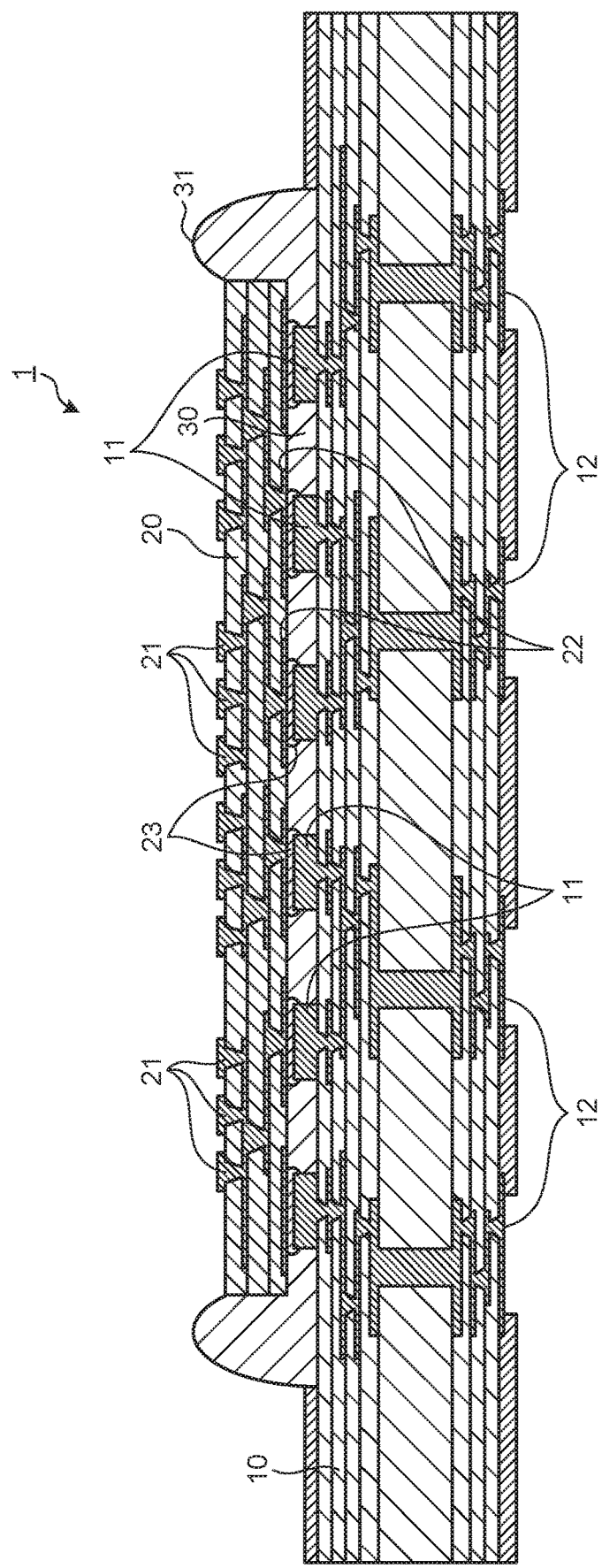
FIG. 1 is a schematic sectional view of an example configuration of an interconnect board according to an example.

FIG. 1 is a schematic sectional view of an example configuration of an interconnect board 1 according to an example. The upper surface in FIG. 1 will be referred to as a "top surface", and the lower surface in FIG. 1 will be referred to as a "bottom surface". As illustrated in FIG. 1, the interconnect board 1 includes a lower substrate 10 and an upper substrate 20. The lower substrate 10 and the upper substrate 20 are bonded to each other with an adhesive layer 30.

The lower substrate 10 is, for example, a multilayer build-up substrate. The lower substrate 10 has a plurality of electrodes 11 on its top surface, and has a plurality of electrodes 12 on its bottom surface. The electrodes 11 will be collectively referred to as an "electrode 11" as appropriate unless otherwise specified. Likewise, the electrodes 12 will be collectively referred to as an "electrode 12" as appropriate unless otherwise specified. The inside of the lower substrate 10 has interconnect layers electrically interconnecting the electrode 11 and the electrode 12. The top surface and the bottom surface of the lower substrate 10 have solder resist selectively applied in a manner of avoiding the electrode 11 and the electrode 12. The lower substrate 10 is an example of a first substrate.

The upper substrate 20 is an interposer substrate that routes connection, for example, between the lower substrate 10 and a semiconductor chip. The upper substrate 20 has a smaller outer shape than that of the lower substrate 10, and is mounted on the lower substrate 10. The upper substrate 20 has a plurality of electrodes 21 to be connected to chips on its top surface, and has a plurality of electrodes 22 on its bottom surface. The electrodes 21 to be connected to chips will be collectively referred to as a "chip electrode 21" as appropriate unless otherwise specified. Likewise, the electrodes 22 will be collectively referred to as an "electrode 22" as appropriate unless otherwise specified. An interconnect layer is formed inside the upper substrate 20 to electrically interconnect the chip electrode 21 and the electrode 22. The electrode 22 is connected to the electrode 11 on the top surface of the lower substrate 10 by a solder 23, such as a solder ball and a solder bump. In this structure, the upper substrate 20 is electrically connected with the lower substrate 10. The upper substrate 20 is an example of a second substrate.

Examples of the adhesive layer 30 include a nonconductive film made of a thermosetting resin. The adhesive layer 30 is used to reduce the stress between the lower substrate 10 and the upper substrate 20, and to bond the lower substrate 10 and upper substrate 20 to each other. The outer edge portion of the adhesive layer 30 forms a fillet, which is a portion sticking out beyond the side surface of the upper substrate 20 and contacting the side surface of the upper substrate 20. The outer edge portion of the adhesive layer 30 will be referred to as a "fillet" as appropriate.

The fillet of the adhesive layer 30 has a raised portion 31 raised from the level of the top surface of the upper substrate 20 to a level higher than the top surface of the upper substrate 20. The raised portion 31 is a frame-like portion arranged along the outer periphery of the upper substrate 20. The raised portion 31 forms a bottomed space in combination with the top surface of the upper substrate 20. The raised portion 31 is high enough to block an underfill resin, which fills the gap between the top surface of the upper substrate 20 and a semiconductor chip mounted thereon, from outflowing. In this structure, the raised portion 31 forms a bottomed space capable of storing the underfill resin, on the top surface of the upper substrate 20.

In the process of bonding the lower substrate 10 and the upper substrate 20 together with the adhesive layer 30, the upper substrate 20 having the adhesive layer 30 is mounted on the lower substrate 10 with the adhesive layer 30 held therebetween. The upper substrate 20 is then pressed against the lower substrate 10 with a bonding tool. The adhesive layer 30 held between the lower substrate 10 and the upper substrate 20 has an outer edge portion extended in a direction perpendicular (that is, horizontally) to the direction of thickness of the adhesive layer 30. The extended outer edge portion sticks out beyond the side surface of the upper substrate 20 and forms a fillet.

Since the fillet formed at the adhesive layer 30 is horizontally extended along the top surface of the lower substrate 10, usable space on the top surface of the lower substrate 10 is narrowed due to the fillet. As a result, it becomes difficult to secure areas for mounting devices around the fillet.

From the above viewpoint, as illustrated in FIG. 1, the interconnect board 1 of this example is configured such that the fillet, sticking out beyond the side surface of the upper substrate 20, has the raised portion 31 raised to a level higher than the level of the top surface of the upper substrate 20. The raised portion 31 allows the fillet to be increased in size in the direction of thickness of the adhesive layer 30, and thus allows to be decreased in size in the horizontal direction. The fillet therefore occupies less space on the top surface of the lower substrate 10. As a result, areas for mounting devices are sufficiently secured around the fillet.

The interconnect board 1 of this example has the raised portion 31 formed as a frame-like portion arranged along the outer periphery of the upper substrate 20. The raised portion 31 forms a bottomed space in combination with the top surface of the upper substrate 20. This structure allows the underfill resin filling the bottomed space to be blocked by the raised portion 31 from outflowing toward the lower substrate 10. Therefore, in the top surface of the lower substrate 10, a situation that device mounting areas surrounding the upper substrate 20 and the adhesive layer 30 are invalidated by the underfill resin is avoided.

Configuration of Semiconductor Package

Figure 2:
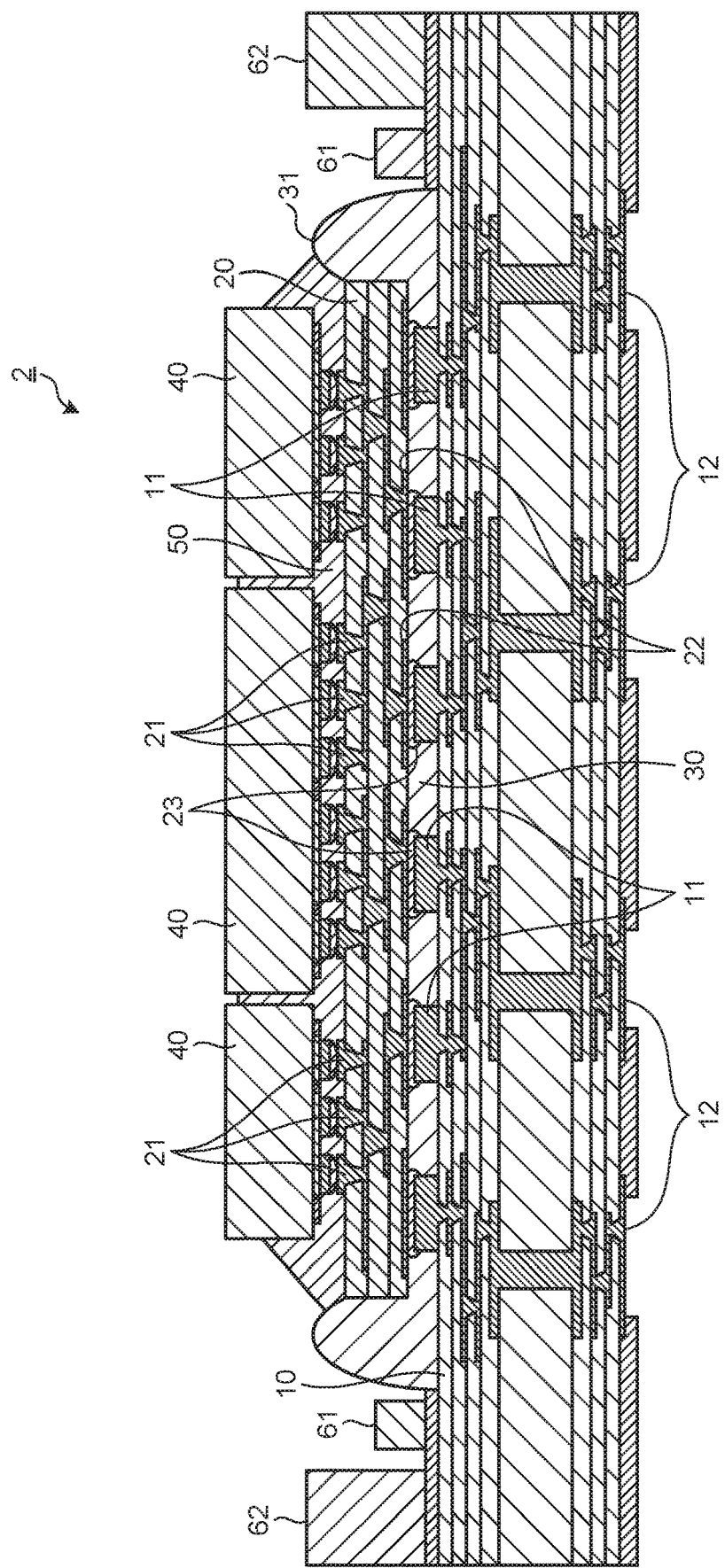
FIG. 2 is a schematic sectional view of an example configuration of a semiconductor package fabricated using the interconnect board of the example.

A semiconductor package 2 fabricated using the interconnect board 1 of the example will now be described with reference to FIG. 2. FIG. 2 is a schematic sectional view of an example configuration of the semiconductor package 2 fabricated using the interconnect board 1 of the example. As illustrated in FIG. 2, the semiconductor package 2 includes the lower substrate 10, the upper substrate 20, and the adhesive layer 30 for bonding the lower substrate 10 and the upper substrate 20 together. The semiconductor package 2 further includes semiconductor chips 40, an underfill resin 50, chip devices 61, and reinforcing members 62. The lower substrate 10, the upper substrate 20, and the adhesive layer 30 respectively correspond to the lower substrate 10, the upper substrate 20, and the adhesive layer 30 as illustrated in FIG. 1.

Examples of the semiconductor chip 40 include an integrated circuit such as large scale integration (LSI). The semiconductor chip 40 is mounted on the chip electrode 21, for example, by the flip-chip technology, on the top surface of the upper substrate 20. The semiconductor chip 40 is connected to the chip electrode 21 on the upper substrate 20 through solder bumps. The semiconductor chip 40 is an example of a semiconductor device.

The underfill resin 50 is arranged in the bottomed space formed by the raised portion 31 of the fillet of the adhesive layer 30 and the top surface of the upper substrate 20 and bonds the upper substrate 20 and the semiconductor chip 40 together.

Examples of the chip device 61 include a resistor and a capacitor, and the chip device is mounted on an area surrounding the upper substrate 20 and the adhesive layer 30, in the top surface of the lower substrate 10. The reinforcing member 62 is used to reinforce the semiconductor package 2, and is mounted on an area surrounding the upper substrate 20 and the adhesive layer 30, in the top surface of the lower substrate 10. For example, the reinforcing member 62 can keep the semiconductor package 2 from being warped.

Fabrication of Interconnect Board

A method of fabricating the interconnect board 1 of the example will now be described with reference to FIG. 3A to FIG. 3I. FIG. 3A to FIG. 3I are illustrative drawings of an example flow to fabricate the interconnect board 1 of the example.

Figure 3A:
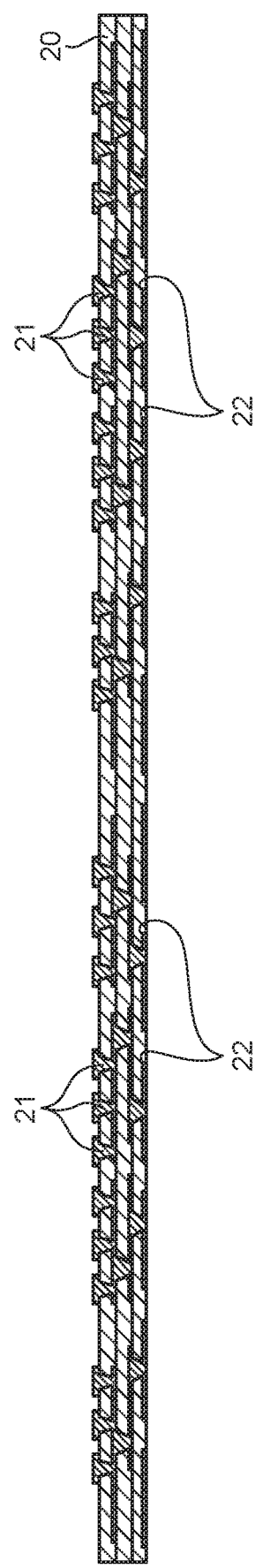
FIG. 3A is an illustrative drawing of an example flow to fabricate the interconnect board according to the example.
Figure 3B:
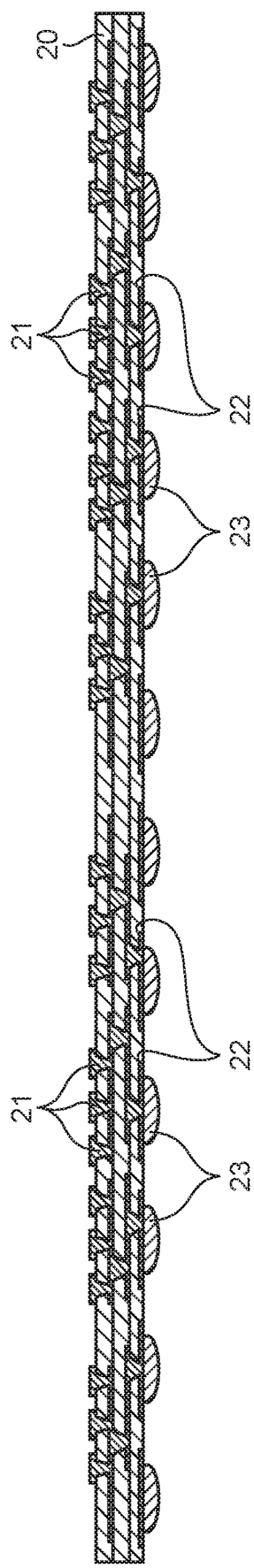
FIG. 3B is another illustrative drawing of the example flow to fabricate the interconnect board according to the example.

As illustrated in FIG. 3A, the upper substrate 20 is fabricated with the chip electrode 21 arranged on the top surface thereof and the electrode 22 on the bottom surface thereof. The upper substrate 20 is fabricated, for example, using the build-up technology. As illustrated in FIG. 3B, a solder 23 is deposited on the electrode 22 on the bottom surface of the upper substrate 20.

Figure 3C:
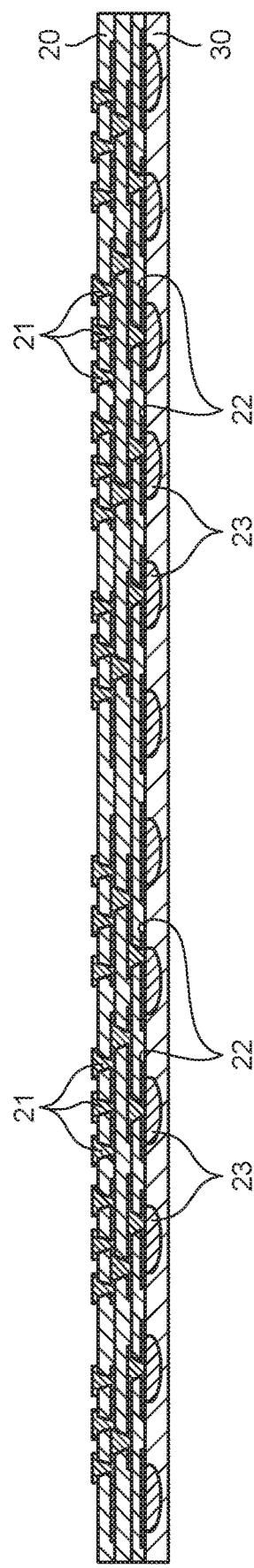
FIG. 3C is still another illustrative drawing of the example flow to fabricate the interconnect board according to the example.

As illustrated in FIG. 3C, the adhesive layer 30 is formed on the bottom surface of the upper substrate 20. For example, if the adhesive layer 30 is a non-conductive film made of a thermosetting resin, the adhesive layer 30 is attached to the bottom surface of the upper substrate 20.

As illustrated in FIG. 3D, the upper substrate 20 is cut into separate pieces by a blade 70. In this process, the upper substrate 20 with the adhesive layer 30 is fabricated.

As illustrated in FIG. 3E, the upper substrate 20 with the adhesive layer 30 is arranged on the lower substrate 10 with the adhesive layer 30 held therebetween. The upper substrate 20 and the lower substrate 10 are positioned to each other such that the solder 23 deposited on the electrode 22 on the bottom surface of the upper substrate 20 faces the electrode 11 on the top surface of the lower substrate 10.

Figure 3F:
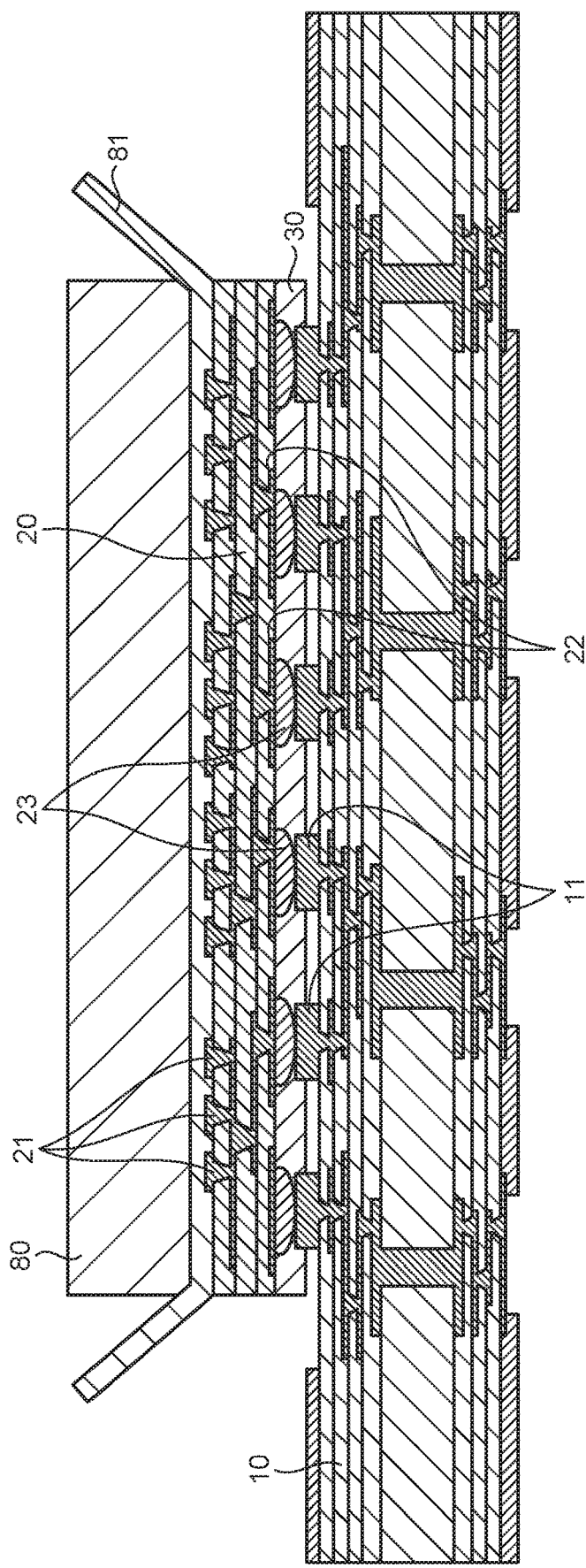
FIG. 3F is still another illustrative drawing of the example flow to fabricate the interconnect board according to the example.

As illustrated in FIG. 3F, a bonding tool 80 is placed to contact the upper substrate 20 through a release sheet 81. During this process, the bonding tool 80 is maintained at a temperature lower than the melting point of the solder 23. The bonding tool 80 has a contact surface to contact the top surface of the upper substrate 20, and the size of the contact surface is substantially as large as that of the top surface of the upper substrate 20. A portion, of the release sheet 81, not contacting the contact surface of the bonding tool 80 is folded obliquely upward from the plane where the top surface of the upper substrate 20 is located. The gap between the release sheet 81 and the top surface of the lower substrate 10 in the direction of thickness of the adhesive layer 30 is therefore increased at areas outside the side surface of the upper substrate 20.

As illustrated in FIG. 3G, the bonding tool 80 presses the upper substrate 20 against the lower substrate 10. The bonding tool 80 continues pressing the upper substrate 20 against the lower substrate 10 until a fillet of the adhesive layer 30 is formed and raised from the level of the top surface of the upper substrate 20 to a level higher than the top surface of the upper substrate 20 to form the raised portion 31. The raised portion 31 is formed with the fillet, as a portion of the adhesive layer 30 sticking out beyond the side surface of the upper substrate 20, passing through the gap between the release sheet 81 and the top surface of the lower substrate 10 and raised in the direction of thickness of the adhesive layer 30. The increase in size of the fillet in the direction of thickness of the adhesive layer 30 keeps the fillet from being horizontally extended. The fillet therefore occupies less space on the top surface of the lower substrate 10. As a result, areas for mounting devices are sufficiently secured around the fillet. The bonding tool 80 further presses the upper substrate 20 until the raised portion 31 becomes high enough to block the underfill resin 50 (see FIG. 2), filling the gap between the top surface of the upper substrate 20 and the semiconductor chip 40 mounted thereon, from overflowing. The raised portion 31 creates a bottomed space capable of storing the underfill resin 50, on the top surface of the upper substrate 20.

Figure 3H:
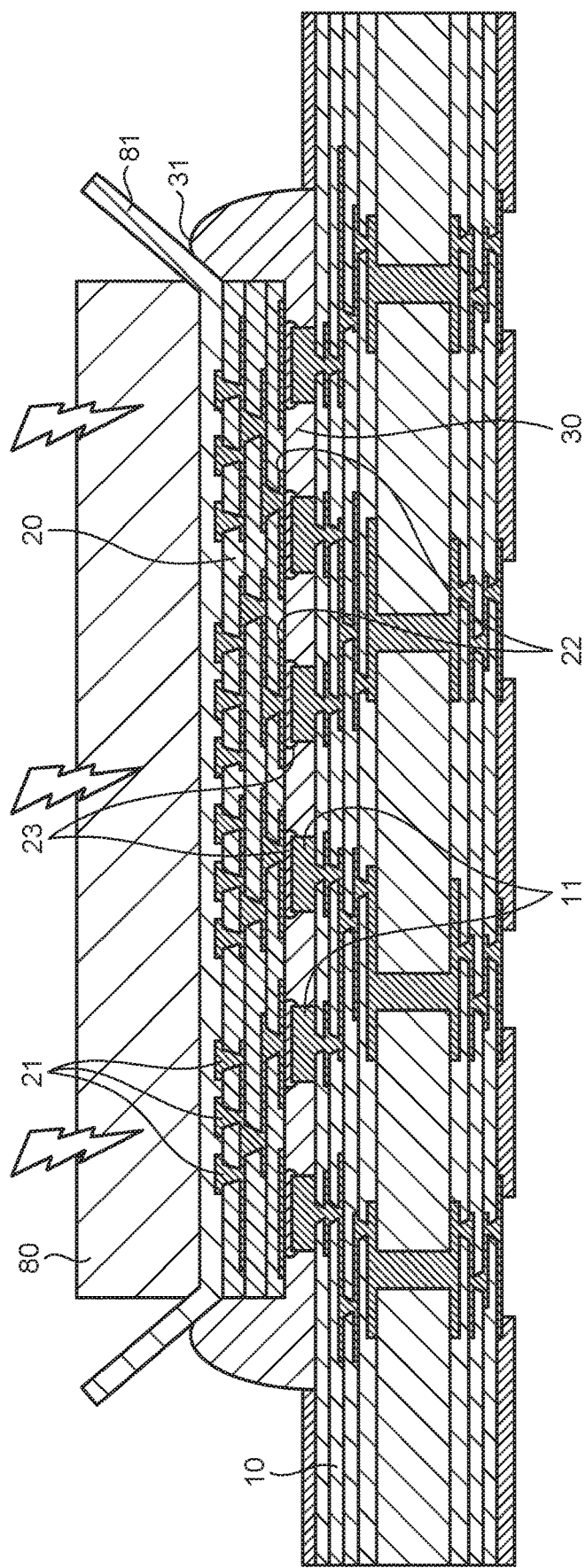
FIG. 3H is still another illustrative drawing of the example flow to fabricate the interconnect board according to the example.

As illustrated in FIG. 3H, the bonding tool 80 is heated to cure the adhesive layer 30 and to solder the electrode 22 on the upper substrate 20 and the electrode 11 on the lower substrate 10. The bonding tool 80 is heated to a temperature equal to or higher than the melting point of the solder 23 deposited on the electrode 22 on the bottom surface of the upper substrate 20. The heated bonding tool allows the lower substrate 10 and the upper substrate 20 to be bonded together through the adhesive layer 30, and melts the solder 23 to connect the electrode 22 on the upper substrate 20 and the electrode 11 on the lower substrate 10.

Figure 3I:
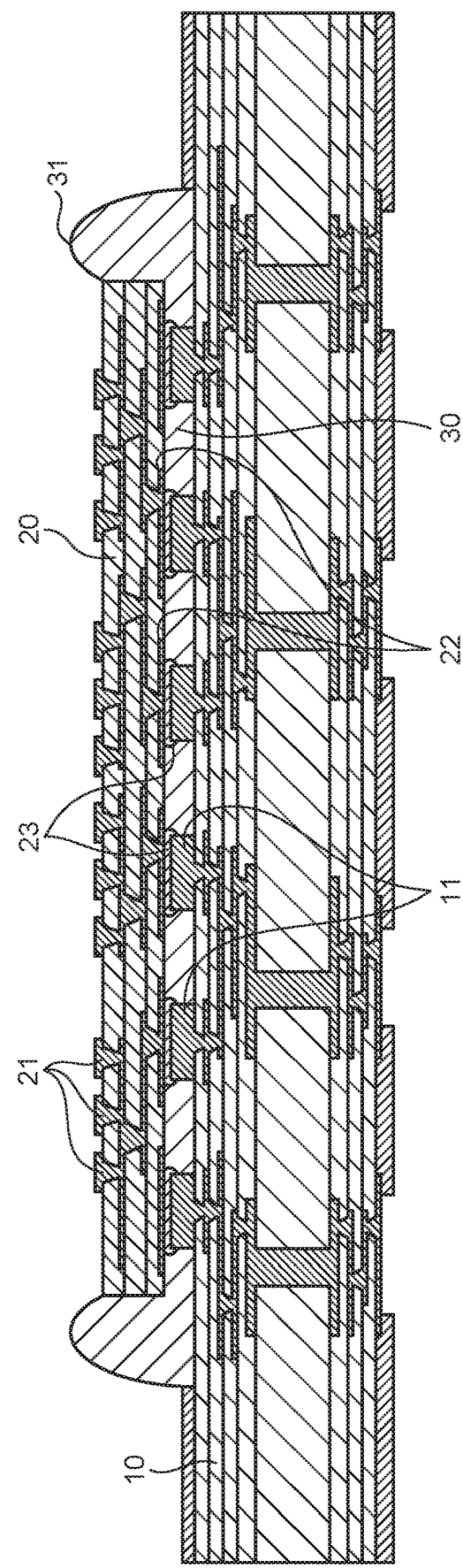
FIG. 3I is still another illustrative drawing of the example flow to fabricate the interconnect board according to the example.

As illustrated in FIG. 3I, the bonding tool 80 and the release sheet 81 are separated from the upper substrate 20, and the interconnect board 1 is fabricated.

In the above description, the process of FIG. 3H is conducted after the process of FIG. 3G; however, these two processes may be conducted together. The process of pressing the upper substrate 20 against the lower substrate 10 and the process of curing the adhesive layer 30 and soldering the electrode 22 on the upper substrate 20 and the electrode 11 on the lower substrate 10 may be conducted at the same time.

Fabrication of Semiconductor Package

Figure 4A:
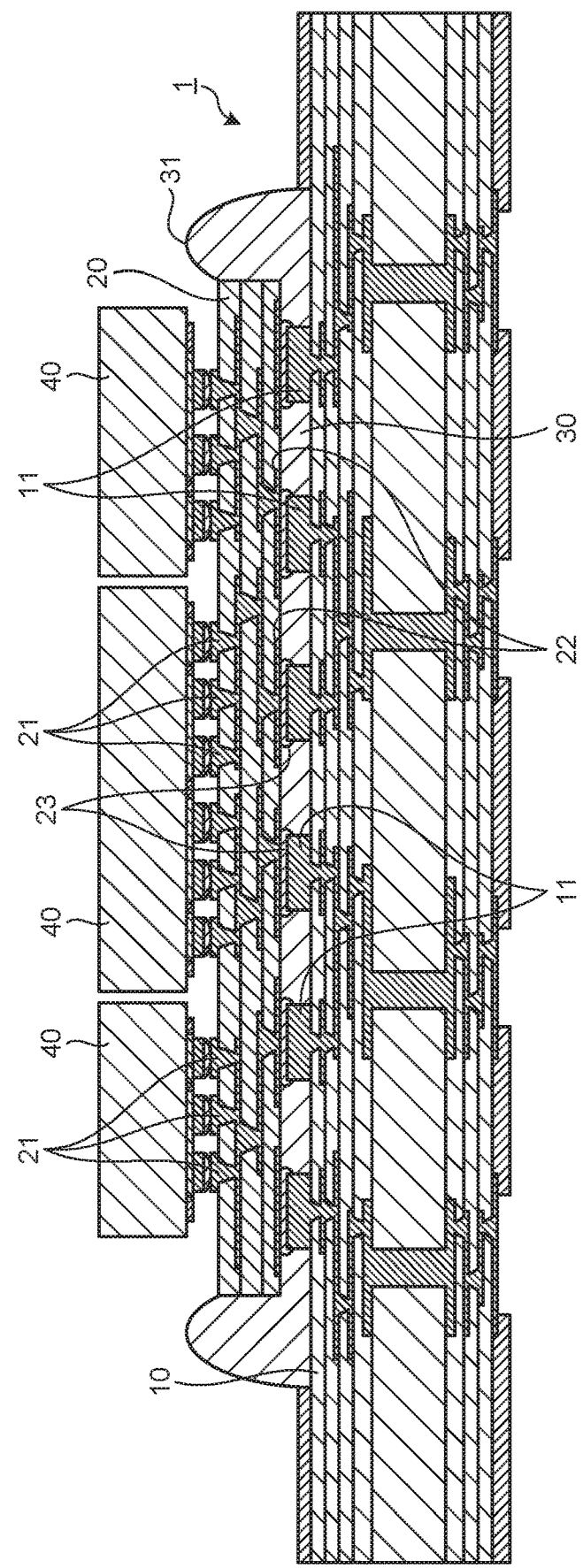
FIG. 4A is an illustrative drawing of an example flow to fabricate the semiconductor package according to the example.
Figure 4B:
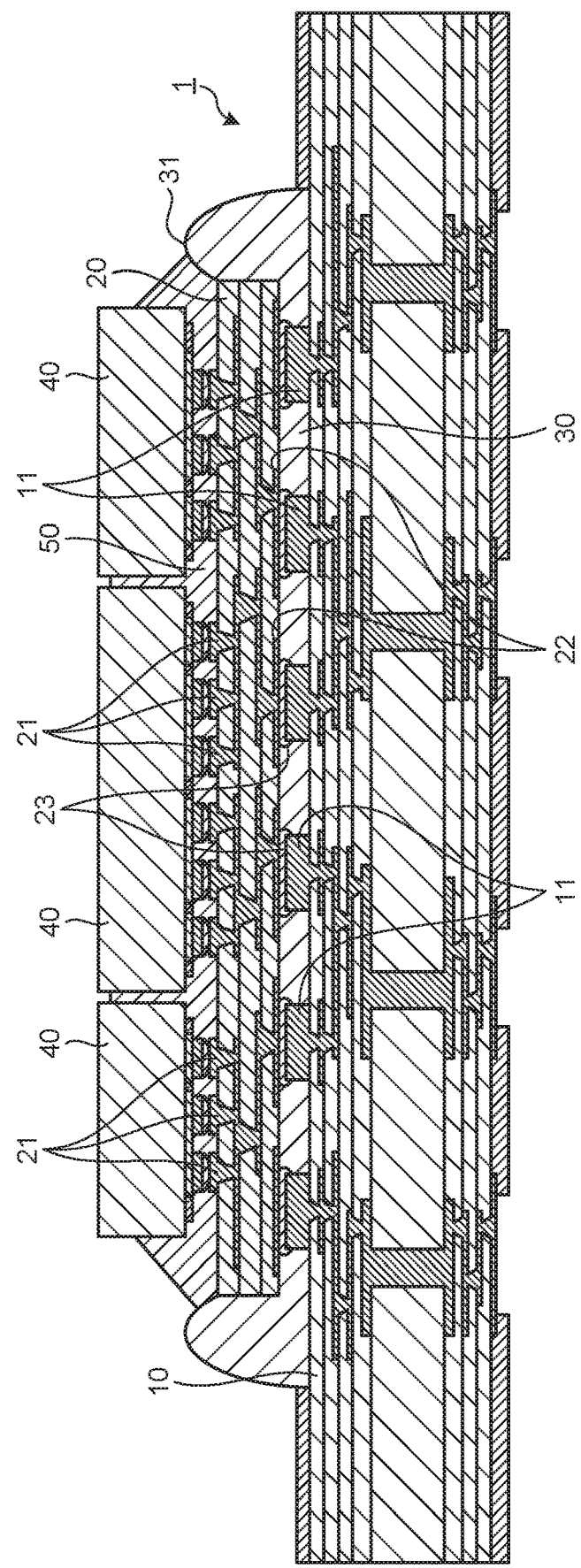
FIG. 4B is another illustrative drawing of the example flow to fabricate the semiconductor package according to the example.
Figure 4C:
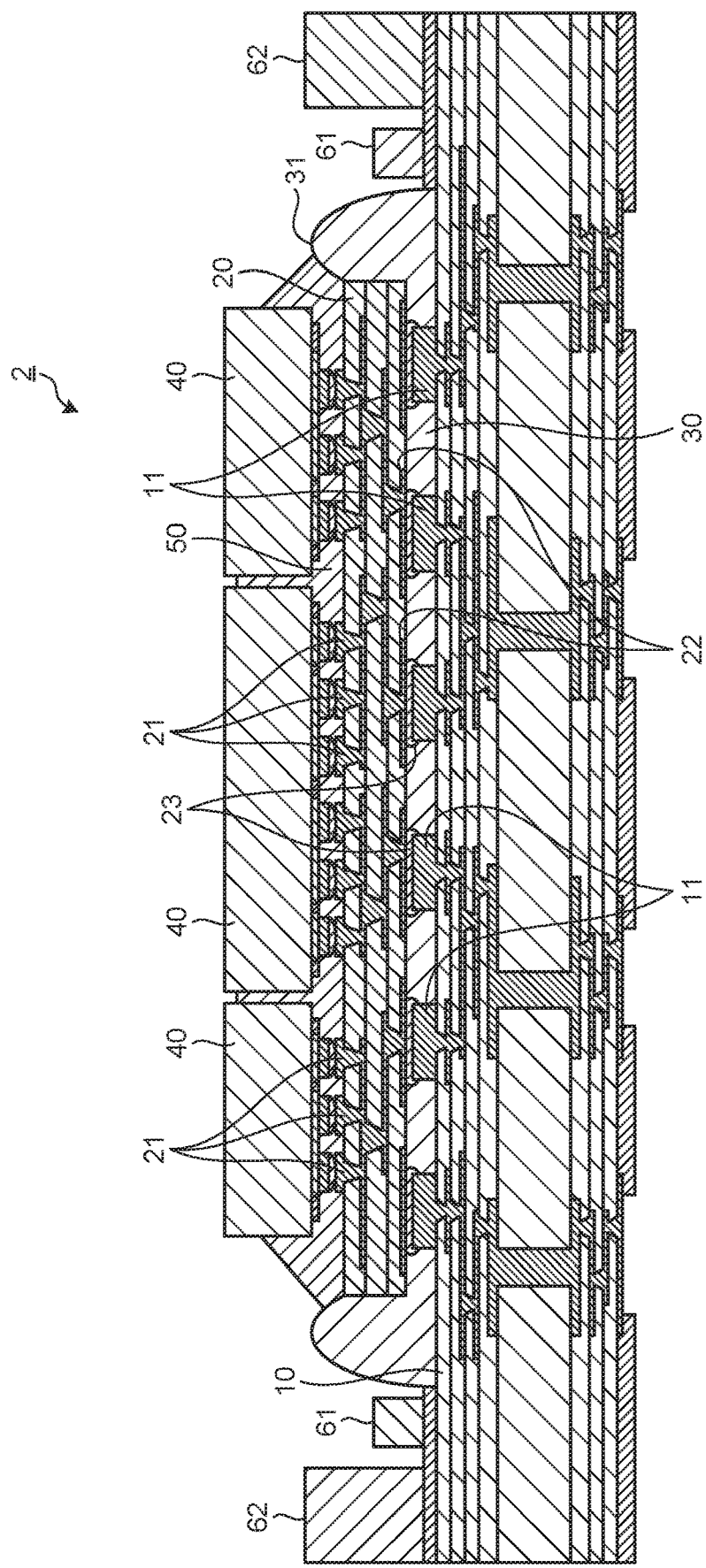
FIG. 4C is still another illustrative drawing of the example flow to fabricate the semiconductor package according to the example.

A method of fabricating the semiconductor package 2 of the example will now be described with reference to FIG. 4A to FIG. 4C. FIG. 4A to FIG. 4C are illustrative drawings of an example flow to fabricate the semiconductor package 2 of the example.

The interconnect board 1 is fabricated in the processes of FIG. 3A to FIG. 3I. As illustrated in FIG. 4A, the semiconductor chip 40 is mounted on the chip electrode 21 on the upper substrate 20 using the flip-chip technology. The semiconductor chip 40 is connected to the chip electrode 21 on the upper substrate 20 through solder bumps.

As illustrated in FIG. 4B, the gap between the top surface of the upper substrate 20 and the semiconductor chip 40 is filled with the underfill resin 50. A bottomed space capable of storing the underfill resin 50 is formed on the top surface of the upper substrate 20 using the raised portion 31 of the adhesive layer 30, and the bottomed space blocks the underfill resin 50 from overflowing to the lower substrate 10. Therefore, in the top surface of the lower substrate 10, a situation that device mounting areas surrounding the upper substrate 20 and the adhesive layer 30 are invalidated by the underfill resin 50 is avoided.

As illustrated in FIG. 4C, components such as the chip device 61 and the reinforcing member 62 are mounted on the device mounting areas surrounding the upper substrate 20 and the adhesive layer 30, in the top surface of the lower substrate 10. The semiconductor package 2 is completed in this manner.

As described above, the interconnect board 1 of the example includes the lower substrate 10, the upper substrate 20 mounted on the lower substrate 10, and the adhesive layer 30 that bonds the lower substrate 10 and the upper substrate 20 together and has a fillet contacting the side surface of the upper substrate 20. The fillet of the adhesive layer 30 has the raised portion 31 raised from the level of the top surface of the upper substrate 20 to a level higher than the top surface of the upper substrate 20. The fillet is increased in size in the direction of thickness of the adhesive layer 30, and is thus decreased in size in the horizontal direction. The fillet therefore occupies less space on the top surface of the lower substrate 10. Areas for mounting devices, such as the chip device 61 and the reinforcing member 62, are therefore sufficiently secured around the fillet.

The interconnect board 1 of the example has the raised portion 31 formed as a frame-like portion arranged along the outer periphery of the upper substrate 20. The raised portion 31 forms a bottomed space in combination with the top surface of the upper substrate 20. The raised portion 31 blocks the underfill resin 50 filling the bottomed space from overflowing to the lower substrate 10. Therefore, in the top surface of the lower substrate 10, a situation that device mounting areas surrounding the upper substrate 20 and the adhesive layer 30 are invalidated by the underfill resin 50 is avoided.

According to an embodiment of the interconnect board of the present application, areas for mounting devices are sufficiently secured around the fillet.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

Note

A method of fabricating an interconnect board, the method comprising:

mounting a second substrate, having an adhesive layer for bonding a first substrate and the second substrate together, on the first substrate with the adhesive layer held between the substrates;

pressing the second substrate against the first substrate with a bonding tool until the adhesive layer forms a fillet that contacts a side surface of the second substrate and the fillet forms a raised portion that is raised from a level of a top surface of the second substrate to a level higher than the top surface of the second substrate; and soldering an electrode of the second substrate and an electrode of the first substrate while curing the adhesive layer by heating the bonding tool.

What is claimed is:

1. An interconnect board comprising:
a first substrate;
a second substrate having an outer shape smaller than an outer shape of the first substrate and mounted on the first substrate; and
an adhesive layer bonding the first substrate and the second substrate together and having a fillet contacting a side surface of the second substrate, wherein
the first substrate has a first electrode on a surface opposing the second substrate,
the second substrate has a second electrode on a first surface opposing the first substrate, and a third electrode on a second surface opposite to the first surface,
the first electrode and the second electrode are joined through a solder,
the fillet has a raised portion raised from a level of the second surface of the second substrate to a level higher than the second surface of the second substrate and not covering the third electrode,
the raised portion has a side surface adjacent to an outer periphery of the second surface and inclined obliquely upward from a plane where the second surface is located at areas outside the side surface of the second substrate, and
the adhesive layer is filled between the first substrate and the second substrate and covers the first surface of the second substrate and the solder.

2. The interconnect board according claim 1, wherein the raised portion is formed as a frame-like portion arranged along the outer periphery of the second substrate and forms a bottomed space in combination with the second surface of the second substrate.

3. A semiconductor package comprising:
the interconnect board according to claim 2;
a first electronic component mounted on the second surface of the second substrate; and
an underfill resin arranged in the bottomed space.

4. The semiconductor package according claim 3, further comprising a second electronic component mounted on the first substrate, wherein
the second electronic component is exposed from the adhesive layer.

5. The interconnect board according claim 1, wherein the first substrate is a multilayer build-up substrate.

6. The interconnect board according claim 1, wherein the second substrate is an interposer substrate.

7. The interconnect board according claim 1, wherein the second substrate is electrically connected with the first substrate through the solder.

8. The interconnect board according claim 1, wherein the adhesive layer is made of a thermosetting resin.

9. The interconnect board according claim 1, wherein the raised portion does not cover the second surface of the second substrate.

10. The interconnect board according claim 1, wherein a top portion of the raised portion that is not obliquely inclined is located only outside the side surface of the second substrate.

11. The interconnect board according claim 1, wherein the adhesive layer is integrally connected to the fillet.

12. The interconnect board according claim 1, wherein the side surface of the raised portion is continuously provided to the outer periphery of the second surface and inclined obliquely upward from the plane where the second surface is located at areas outside the side surface of the second substrate.

13. An interconnect board comprising:
a first substrate;
a second substrate having an outer shape smaller than an outer shape of the first substrate and mounted on the first substrate; and
an adhesive layer bonding the first substrate and the second substrate together and having a fillet contacting a side surface of the second substrate, wherein
the first substrate has a first electrode on a surface opposing the second substrate,
the second substrate has a second electrode on a first surface opposing the first substrate, and a third electrode on a second surface opposite to the first surface,
the first electrode and the second electrode are joined through a solder,
the fillet has a raised portion raised from a level of the second surface of the second substrate to a level higher than the second surface of the second substrate and not covering the third electrode,
the raised portion has a side surface adjacent to an outer periphery of the second surface and inclined obliquely upward from a plane where the second surface is located at areas outside the side surface of the second substrate, and between the first substrate and the second substrate, the adhesive layer is filled and an electronic component is not disposed.

14. An interconnect board comprising:

a first substrate;

a second substrate having an outer shape smaller than an outer shape of the first substrate and mounted on the first substrate; and an adhesive layer bonding the first substrate and the second substrate together and having a fillet contacting a side surface of the second substrate, wherein the first substrate has a first electrode on a surface opposing the second substrate, the second substrate has a second electrode on a first surface opposing the first substrate, and a third electrode on a second surface opposite to the first surface, the first electrode and the second electrode are joined through a solder, the fillet has a raised portion raised from a level of the second surface of the second substrate to a level higher than the second surface of the second substrate and not covering the third electrode, and the raised portion has a side surface adjacent to an outer periphery of the second surface and inclined obliquely upward from a plane where the second surface is located at areas outside the side surface of the second substrate, a top portion of the raised portion being rounded in a sectional shape.

* * * * *